(12) United States Patent
Strauch

(10) Patent No.: US 9,018,105 B2
(45) Date of Patent: Apr. 28, 2015

(54) CVD METHOD AND CVD REACTOR

(75) Inventor: Gerhard Karl Strauch, Aachen (DE)

(73) Assignee: Aixtron SE, Herzogenrath (DE)

( * ) Notice: Subject to any disclaimer, the term of this patent is extended or adjusted under 35 U.S.C. 154(b) by 354 days.

(21) Appl. No.: 13/391,609

(22) PCT Filed: Aug. 4, 2010

(86) PCT No.: PCT/EP2010/061360
§ 371 (c)(1),
(2), (4) Date: Feb. 21, 2012

(87) PCT Pub. No.: WO2011/023512
PCT Pub. Date: Mar. 3, 2011

(65) Prior Publication Data
US 2012/0149212 A1    Jun. 14, 2012

(30) Foreign Application Priority Data

Aug. 25, 2009 (DE) .......................... 10 2009 043 848

(51) Int. Cl.
*H01L 21/31* (2006.01)
*C23C 16/44* (2006.01)

(52) U.S. Cl.
CPC .................................. *C23C 16/4412* (2013.01)

(58) Field of Classification Search
USPC ....................................................... 438/763
See application file for complete search history.

(56) References Cited

U.S. PATENT DOCUMENTS 4,503,807 A    3/1985    Nakayama et al.
4,849,260 A    7/1989    Kusumoto
(Continued)

FOREIGN PATENT DOCUMENTS

EP    0449821 B1    5/1994
EP    0687749 B1    9/1996
(Continued)

OTHER PUBLICATIONS

PCT/EP2010/061360 International Preliminary Report on Patentability Mar. 6, 2012.
(Continued)

*Primary Examiner* — Charles Garber
*Assistant Examiner* — Stanetta Isaac
(74) *Attorney, Agent, or Firm* — Ascenda Law Group, PC

(57) ABSTRACT

The invention relates to a device and a method for depositing semiconductor layers, in particular made of a plurality of components on one or more substrates (21) contacting a susceptor (2), wherein process gases can be introduced into the process chamber (1) through flow channels (15, 16; 18) of a gas inlet organ (8), together with a carrier gas, said carrier gas permeating the process chamber (1) substantially parallel to the susceptor and exits through a gas outlet organ (7), wherein the products of decomposition build up the process gases as a coating at least in regions on the substrate surface and on the surface of the gas outlet organ (7) disposed downstream of the susceptor (2) at a distance (D) from the downstream edge (21) thereof. In order to deposit contamination-free layers in sequential process steps without intermediate replacement or intermediate cleaning of the gas outlet organ, according to the invention the distance (D) is great enough to prevent products of decomposition outgassing from the coating of the gas outlet organ (7) at the second process temperature from reaching the substrate (21) by counterflow diffusion.

17 Claims, 4 Drawing Sheets

(56) References Cited

U.S. PATENT DOCUMENTS

| | | | |
|---|---|---|---|
| 5,578,521 A | 11/1996 | Suzuki et al. | |
| 5,891,251 A | 4/1999 | MacLeish et al. | |
| 5,891,281 A | 4/1999 | Giordano et al. | |
| 5,951,772 A | 9/1999 | Matsuse et al. | |
| 2002/0000196 A1* | 1/2002 | Park | 118/715 |
| 2003/0136365 A1 | 7/2003 | Komai et al. | |
| 2004/0003779 A1* | 1/2004 | Jurgensen et al. | 118/723 I |
| 2004/0200412 A1 | 10/2004 | Frijlink | |
| 2004/0237894 A1 | 12/2004 | Han et al. | |
| 2005/0011441 A1* | 1/2005 | Kannan | 118/715 |
| 2006/0201427 A1* | 9/2006 | Jurgensen et al. | 118/715 |
| 2006/0225649 A1* | 10/2006 | Courville | 118/715 |
| 2007/0259502 A1* | 11/2007 | Bour et al. | 438/285 |
| 2008/0050510 A1* | 2/2008 | Stevens et al. | 427/8 |
| 2008/0050889 A1* | 2/2008 | Bour et al. | 438/479 |
| 2008/0272463 A1* | 11/2008 | Butcher et al. | 257/615 |
| 2009/0044699 A1 | 2/2009 | Carlson | |
| 2009/0114155 A1 | 5/2009 | Sawayama et al. | |

FOREIGN PATENT DOCUMENTS

| | | |
|---|---|---|
| EP | 1060301 B1 | 1/2003 |
| JP | 59223294 A | 12/1984 |
| JP | 08078338 A | 3/1996 |
| JP | 10306375 A | 11/1998 |
| WO | 2008130448 A2 | 10/2008 |

OTHER PUBLICATIONS

PCT/EP2010/061360 Written Opinion of the International Searching Authority Nov. 5, 2010.
PCT/EP2010/061360 International Search Report Nov. 5, 2010.
Aixtron SE; EP Application No. 10740629.0; Request for Entry into the European Phase dated Mar. 5, 2012 (12 pages).
Aixtron SE; EP Application No. 10740629.0; Communication Concerning Correction of Deficiencies dated Jun. 15, 2012 (2 pages).
Aixtron, SE; EP Application No. 10740629.0, Amended Claims and Description dated Dec. 1, 2012 (7 pages).

* cited by examiner

CVD METHOD AND CVD REACTOR

CROSS REFERENCE TO RELATED APPLICATIONS

This is a NATIONAL STAGE under 35 USC 371 of and claims priority to International Application PCT/EP2010/061360, filed 04 Aug. 2010, incorporated herein by reference, which claims priority to DE 10 2009 043848.3 filed 25 Aug. 2009.

FIELD OF THE INVENTION

The invention relates to a method for depositing semiconductor layers consisting in particular of a plurality of components on one or more substrates which are supported on a susceptor, the susceptor forming a wall portion of a process chamber, said wall portion being heated by a heating device to a process temperature, process gases provided by a gas mixing system being introduced together with a carrier gas into the process chamber through flow channels of a gas inlet element, which carrier gas flows into the process chamber substantially parallel to the susceptor, the process gases decomposing into products of decomposition in a pyrolytic manner at least on the surface of the heated substrate and the decomposition products growing to form a coating as least in certain regions on the substrate surface and on the surface of the gas outlet element that is located downstream at a spacing from the downstream edge of the susceptor, a first process step being carried out at a first process temperature and after that, a second process step being carried out at a second process temperature without intervening cleaning or exchange of the gas outlet element coated by growth of decomposition products, the second process temperature being higher than the first process temperature.

The invention furthermore relates to an apparatus for depositing semiconductor layers consisting in particular of a plurality of components on one or more substrates, comprising a susceptor, on which the substrate is supported and which forms a wall portion of a process chamber, said wall portion being heated by a heating device to a process temperature, comprising a gas inlet element connected to a gas mixing system by means of gas feed lines, process gases provided by the gas mixing system being introducible together with a carrier gas into the process chamber through flow channels of the gas inlet element, and the flow channels being arranged in the process chamber in such a way that the carrier gas flows through the process chamber substantially parallel to the susceptor, the susceptor and the gas outlet element that is located downstream from the susceptor and at a spacing from the downstream edge of the susceptor being heatable directly or indirectly by the heating device in such a way that the process gases decompose into products of decomposition at least on the surface of the substrate and the decomposition products grow to form a coating as least in certain regions, in a pyrolytic manner, on the hot surfaces of the substrate and the gas outlet element.

BACKGROUND

An apparatus of the generic kind is described in DE 100 43 600 A1, EP 1 060 301 B1 and EP 1 240 366 B1. The devices have a reactor housing, which is closed in gas-tight manner against the environment. There is a process chamber within the reactor housing. This has the form of a circular cylinder. The disk-shaped floor of the process chamber is formed by a multi-part susceptor consisting of graphite, which has on its side facing the process chamber a multiplicity of recesses arranged around the center, in which disk-shaped substrate holders are enclosed, on the surface of which in each case a substrate to be coated is supported. The substrate holders are driven in rotation, supported on a gas cushion by a gas flow. The susceptor that rests on a central pillar may likewise be rotated about the axis of symmetry of the process chamber. Above the susceptor that extends in a horizontal plane, there is a process chamber ceiling which likewise is made of graphite. In the center of the process chamber ceiling, there is a gas inlet element which is connected by feed lines to a gas mixing system by which outlet channels of the gas inlet element are supplied with a carrier gas and with process gases transported by the carrier gas. The process gases may be on the one hand an organometallic substance, e.g. TMGa, TMIn or TMAl. The other process gas is a hydride, e.g. arsine, phosphine or ammonia. Using these process gases, semiconductor layers are to be deposited on the substrate surface, which layers may consist of Ga, In, Al, P, As and N. Using the apparatus, there can be deposited not only III-V semiconductor layers, but also, by suitable choice of the starting materials, II-VI semiconductor layers. It is furthermore possible to dope the deposited semiconductor layers by the addition of suitable further highly diluted starting materials.

The process gases introduced into the center of the process chamber with the carrier gas flow through the process chamber in the horizontal direction parallel to the process chamber ceiling and the process chamber floor. The process chamber floor and the optionally also the process chamber ceiling are heated to a process temperature. This is effected by an RF heater. For this, there are, underneath the susceptor, windings of a water-cooled heating spiral. The process gases decompose pyrolytically into decomposition products on the hot surfaces and in particular on the hot substrate surface. The process is conducted in such a way that the growth of the semiconductor layers on the substrate takes place in a kinetically controlled temperature range, since in this temperature range, the highest crystal quality can be achieved. It cannot be avoided that during the process, a parasitic coating grows on the surface regions of the susceptor that surround the substrates, on the underside of the process chamber ceiling, and on a gas outlet element that forms the downstream wall of the process chamber.

The thermal treatment processes that take place in the apparatus under discussion require process temperatures of different magnitudes. In a generic method, a first layer of a first material is deposited on the substrate in a first process step. This is effected at a low process temperature, which can be for example in the range from 500° C. to 800° C. After one or more purge steps and optionally also further intermediate steps, a second process step is carried out for which the process temperature is significantly higher, e.g. is at least 1,000° C. In this process step, a layer of a second material is deposited onto the first layer or onto further intermediate layers. The gas outlet element that was coated with decomposition products in the first process step was neither cleaned nor changed in the intervening period between the first and second process steps. In a subsequent analysis of the layer deposited in the second process step, traces were found of the decomposition products of the process gases introduced into the process chamber in the first process step.

Using the generic apparatus, there can furthermore also be carried out a deposition method which begins with a process step that is carried out with a very high process temperature, e.g. 1,600° C. This process step may be a heat treatment step. If, in a previous deposition process on a substrate which was exchanged between steps, a growth step was carried out at a lower temperature, there was a parasitic coating of the gas outlet element. If the gas outlet element has not been replaced when the substrate was changed, a contaminated gas outlet element is present for the following coating operation during the heat treatment process. Also for this process procedure, a first process step at a low temperature in which growth of a layer takes place is followed by a second process step at a high process temperature. Here also, it was established by a subsequent analysis of the layers deposited that products of decomposition from the earlier process step had been incorporated into later-deposited layers.

Also belonging to the prior art is EP 0 449 821, which describes a CVD reactor in which a susceptor on which substrates to be coated are supported, is heated from beneath. The process chamber which is closed at the top by a cover is flowed through in the horizontal direction by process gas. In order to prevent a recirculation of the reaction gas at the gas outlet end, stabilizer vanes are provided, which define narrow channels through which the gas flows.

EP 0 252 667 describes a CVD reactor having a process chamber, the floor of which forms a rotatable susceptor on which a substrate is supported. A process gas flows through the process chamber in the horizontal direction, the process gas being urged from above in the direction of the susceptor by introduction of an additional inert gas. In this way, a laminar flow of gas is established over the substrate to be coated.

U.S. Pat. No. 5,891,251 describes a CVD reactor having a process chamber heated from beneath, through which flow takes place horizontally. Here also, additional inert gas streams are provided in order to influence the flow pattern of the process gas.

U.S. Pat. No. 5,951,772 describes a CVD reactor having a process chamber, the floor of which forms a susceptor, which is heated from below by a lamp. There is a shower-head type gas inlet element above the susceptor. The walls of the process chamber are heated. On a level lower than the susceptor, there is a gas outlet, in order to suck away process gas out of the process chamber by means of a pump.

US 2002/0000196 A1 describes a CVD reactor having a process chamber with a shower-head type gas inlet element and a substrate to be coated which is heated from below.

US 2003/0136365 A1 shows a gas outlet tube. It has an inner tube provided with a heating sleeve.

US 2005/0011441 A1 describes a CVD reactor having a susceptor on which a substrate to be coated is supported, the substrate being heated from below. A gas outlet is provided which lies at a lower level than the susceptor.

US 2006/0225649 A1 describes a CVD reactor with a shower-head type gas inlet element and a susceptor forming the floor of a process chamber, on which susceptor the substrate is supported. A gas outlet annulus is provided, this surrounding the susceptor at a spacing that leaves a gap.

US 2009/0044699 A1 tackles the problem of polymer formation in a gas outlet system. By means of a heater located there, the chemical bonds of the polymers are to be broken.

US 2009/0114155 A1 is concerned with a CVD reactor and a condensation trap located in the gas outlet flow, which trap can be heated.

JP 08078338 A describes a CVD reactor in which the substrate is held in a suspended state, so that it can be coated from both sides.

JP 10306375 A describes a special gas-mixing system for a CVD reactor, the valve arrangement of the system being selected so that pressure fluctuations within the process chamber are reduced.

SUMMARY OF THE INVENTION

It is an object of the invention to provide arrangements by which contamination-free layers can be deposited in process steps that follow one another without intervening exchange or intervening cleaning of the gas outlet element.

This object is met by the invention specified in the claims. The subsidiary claims represent advantageous improvements of the associated independent claims. In addition however, the subsidiary claims also provide independent solutions of the problem and may be combined with one another in any desired manner.

The invention is based on the recognition gained in the course of experiments and model calculations that the observed layer contamination has its origin in the coating of the gas outlet element. For this, the contamination was investigated in a series of experiments using test layers that had been very highly doped. The extent of the contamination was objectified at the interface between the substrate and a second layer, compared with an interface between the substrate and a first layer. In the course of the experiments it was found that the surface temperature of the gas outlet element also changes significantly. This observation was also made on apparatus such as is described by EP 1 240 366 B1, in which the gas outlet element can be lowered for changing the substrate and has for this a spacing from the susceptor. A small spacing of this kind between the susceptor and the gas outlet element is also shown in FIG. 1 of EP 1 060 301 B1. In the flow reactors under discussion, the process gases flow through the process chamber in the horizontal direction. A flow barrier is formed between the susceptor and the gas outlet element. The decomposition products, which for the lower process temperatures grow parasitically on the surface of the gas outlet element, have the tendency to evaporate from the surface of the gas outlet element in the second process step, in which hitherto not only the susceptor but also the gas outlet element are heated to a significantly higher temperature. The components that thus get into the gas phase diffuse in all directions, accordingly also against the gas flow. It was recognized that this counter-flow diffusion is answerable for the unwanted contamination of the layers deposited in the second process step or layers deposited later. Even in the case of solely a heat-treatment step carried out at a high temperature, there is a contamination of the heat-treated substrate surface, since the decomposition products that evaporate from the gas outlet at the high process temperatures diffuse into the process chamber right up to the substrate and attach themselves there to the surface.

The measures according to the invention, in order to counter this drawback, reside, in the construction of the apparatus, in the spacing between the downstream edge of the susceptor and the gas outlet element being made to be sufficiently great to prevent decomposition products, or fragments or agglomerations of decomposition products, that evaporate from the coating on the gas outlet element, from reaching the substrate by counter-flow diffusion or recirculation. Furthermore, the measure according to the invention relates to a separate temperature control of the gas outlet element. This is effected in such a way that surface temperatures of the gas outlet element differ from each other only to an insignificant extent during process steps using different process temperatures. In corresponding manner, the method is carried out in such a way that the conditions in the gas phase, temperature, pressure and the like, are adjusted so that the spacing between the downstream edge of the susceptor and the gas outlet element is sufficiently great to prevent decomposition products, or fragments or agglomerations of decomposition products, evaporating at the second process temperature from the coating on the gas outlet element, from reaching the substrate by counter-flow diffusion or recirculation. For this, alternatively or optionally in addition, the temperature of the gas outlet element can be controlled during the two process steps in such a way that its surface temperatures differ from one another only to an unimportant extent during both process steps. This temperature range may be 100° C. and more throughout. It depends on the chemical and physical properties of the coating on the gas outlet element. It is optimal if the surface that is nearest to the susceptor has a spacing from the susceptor that equates to three times the diffusion length. There is in question here the counter-flow diffusion length that is dependent on the flow speed. This reverse diffusion length is defined by a path within which the gas phase concentration of the evaporated decomposition products has sunk to 1/e. The temperature control of the gas outlet element is effected by way of one or more heating spirals disposed underneath the susceptor and in particular by an outer heating winding. In this way, the gas outlet element is actively heated separately. For this, the heating winding is in the immediate vicinity of the gas outlet element that encircles the process chamber in an annular manner. The gas outlet element is made of an electrically conducting material, so that it can be heated by means of eddy currents, which are generated by RF-coils. In a preferred embodiment it is provided that the gas outlet element is disposed vertically lower than the susceptor that extends in the horizontal plane. By the positioning and the active heating of the gas outlet element, its surface can be controlled as to temperature substantially independently of the execution of the process. The surface temperature of the gas outlet element thus fluctuates significantly less than the surface temperature of the susceptor. The surface temperature of the susceptor may be different throughout by more than 500° C. for different process steps. The gas outlet element is actively heated in such a way that there is only a variation in temperature of at most 100° C. in the case of a temperature variation of the susceptor of the foregoing kind. In a process with a homogeneous gas phase reaction, in which the decomposition products develop not only by pyrolytic decomposition at the surface, but gas phase reactions also take place, the gas outlet element must have a temperature which is above the adduct formation temperature. This is also required for the process chamber ceiling, which is actively heated in such processes. In processes of this kind, in particular the organometallic components decompose by way of a plurality of intermediate steps into elementary metal, e.g. gallium, indium or aluminum. At the usual process temperatures, these metals are however not volatile on account of their low vapor pressure. There is thus nucleation in the gas phase. This nucleation is the reason for adduct formation. This should be prevented. For this it is necessary to guarantee that no cold zones come about within the process chamber. The susceptor, which consists of graphite, is mounted on a support plate that consists of quartz. The edge of this support plate is fixed on the downstream edge of the susceptor. The gas outlet annulus that is made likewise of graphite adjoins directly at the edge of this support plate. This annulus has openings with their mouths at the level of the quartz plate, through which openings the carrier gas can flow into a collecting volume of the gas outlet element. The gas outlet volume is connected to a discharge channel, which is connected to a vacuum pump. In the case of the CVD reactor according to the invention, gas inlet elements may be used such as are known in principle in the prior art. For example, a gas inlet element may be used which is disposed in the center of a circular process chamber. This gas inlet element has at least two flow channels that are separate from one another, through which an organometallic substance and a hydride reach the process chamber. These flow channels are connected via feed lines, mass flow regulators and valves, with reservoirs in which the carrier gas and the process gases are stored. Hydrogen, nitrogen or a noble gas may be used as carrier gas. As an alternative to a central gas inlet element, there may also be used a gas inlet element in the form of a showerhead, as is e.g. described in EP 0 687 749 B1. This forms the ceiling of the process chamber and has a multiplicity of outlet openings distributed uniformly over the entire area, from which openings the process gases can enter into the process chamber. The various process gases may here enter the process chamber through different gas outlet openings. Here also a gas flow is generated which moves substantially parallel to the surface of the susceptor.

BRIEF DESCRIPTION OF THE DRAWINGS

Exemplary embodiments of the invention will be described below with reference to accompanying drawings in which.

DETAILED DESCRIPTION

Figure 1:
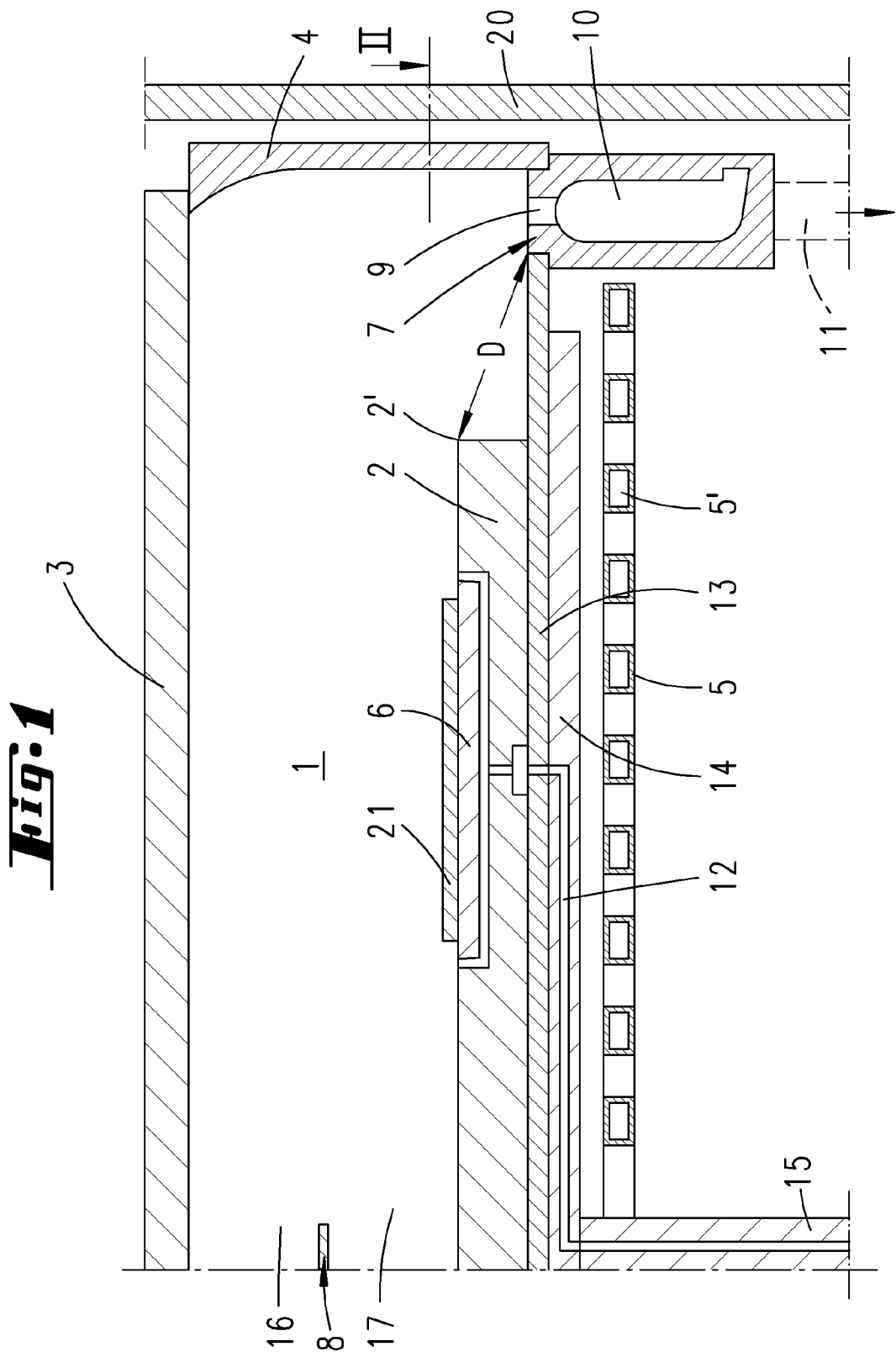
FIG. 1 shows a half cross-section through a first exemplary embodiment of an apparatus.
Figure 2:
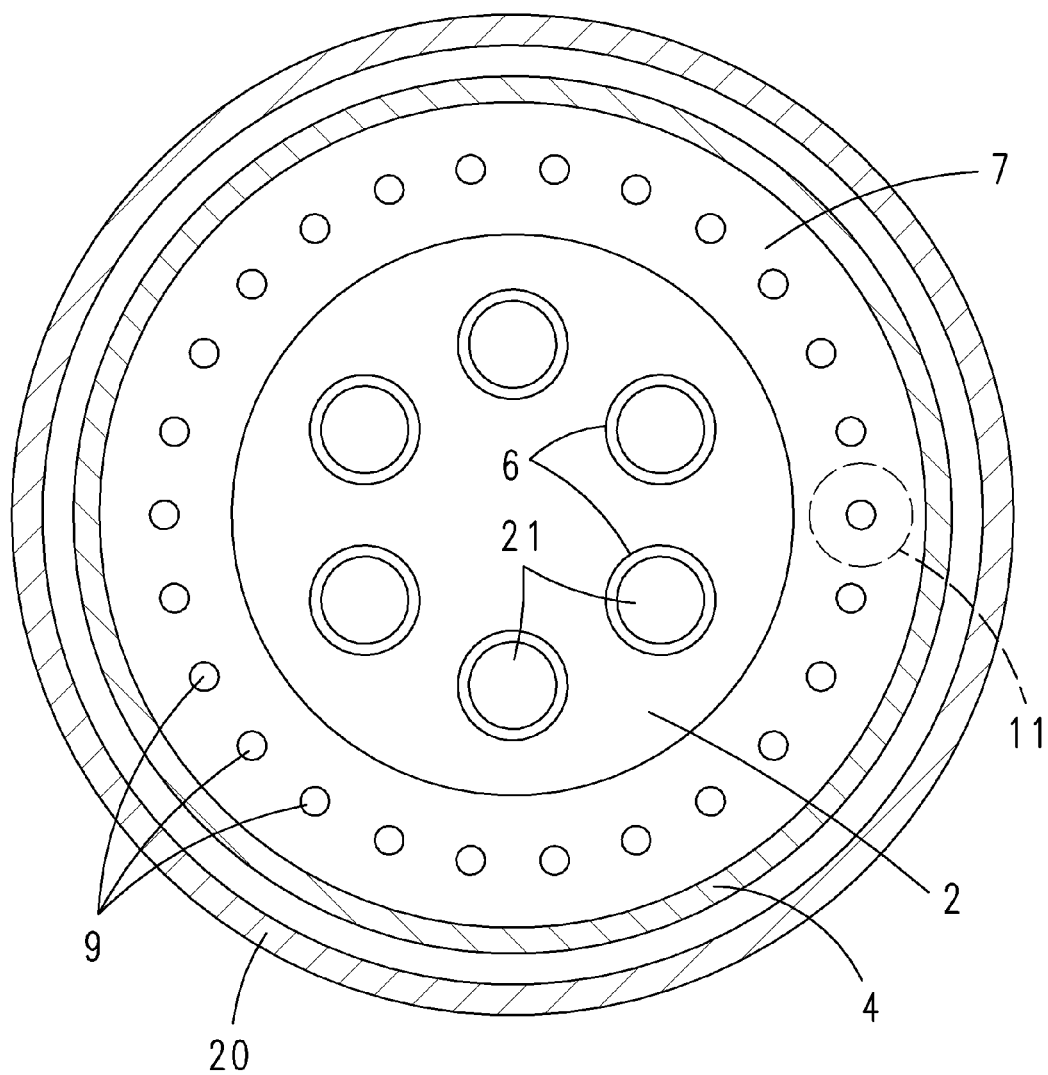
FIG. 2 shows a section on the line II-II in FIG. 1.

The gas mixing system 22 suitable for the supply of an apparatus according to the invention has a reservoir 23 for an organometallic substance, a reservoir 24 for a carrier gas and a reservoir 25 for a hydride. The organometallic substance may be TMGa, TMIn, TMAl or the like. The carrier gas may be hydrogen, nitrogen or a noble gas. The hydride may be $AsH_3$, $PH_3$ or $NH_3$. Not illustrated are optional further reservoirs for storage of further process gases and in particular dopants. The process gases and the carrier gas are metered by way of mass flow controllers 26, the valves of which are upstream. Optimally the supply is effected by way of a not illustrated vent/run system. The feed lines 27, 28 end in the gas inlet element.

In the exemplary embodiment illustrated in FIG. 1, the gas inlet element 8 is disposed at the center of a rotationally symmetrical process chamber 1. The floor of the process chamber is formed by a susceptor 2 made of graphite, which has a multiplicity of surface recesses in which in each case a circular substrate holder 6 is enclosed. A supporting gas is introduced into the recess via nozzles by way of a gas feed line 12, so that the substrate holder 6 is bearingly rotated on a gas cushion. The individual substrate holders 6 surround the center of the process chamber 1 in a circular arrangement.

The susceptor 2 rests on a support plate 13 of quartz. The edge portion of the support plate 13 extends outwards in the radial direction beyond the downstream edge 2'. The edge portion of the quartz plate 13 that forms a diffusion barrier extends beyond the edge 2' of the susceptor 2 by a distance D, which represents a dimension that is relevant to the process.

The quartz plate 13 is mounted on a distributor plate 14, by means of which the supporting gases are delivered to the susceptor 2. A column is indicated by the reference numeral 15, which may be configured so that the susceptor 2 can be driven in rotation about its axis.

An RF heating coil 5 of spiral configuration is located underneath the susceptor 2 and underneath the plates 13, 14. The body of the coil is a hollow body through which a cooling medium flows.

The radially outermost winding 5' of the RF heating spiral 5, which may optionally be separately supplied with heat energy, lies in the immediate neighborhood of a gas outlet element 7.

The gas outlet element 7 consists of an annular body, which is made from molybdenum or preferably from graphite. The gas outlet element 7 directly adjoins the radially outer edge of the quartz plate 13. The gas outlet element 7 has upwardly facing openings 9, through which gas can flow out of the process chamber 1 into a collecting volume 10. The collecting volume 10 is linked by way of a discharge channel 11 to a vacuum pump. The entire apparatus described is located within a reactor housing 20, by which the process chamber 1 is shielded in a gas-tight manner against the outer world. The upper wall of the process chamber 1 is formed by a process chamber ceiling 3, which likewise consists of graphite. This latter may also be separately heated—as is described in the prior art, in particular in DE 100 43 600 A1. The side wall of the process chamber 1 is formed by an annular side wall 4.

The gas outlet member 7 is located at a downstream spacing from the susceptor 2. It is spaced in the horizontal direction and, in the vertical direction, is at a lower level than the susceptor 2. The gas outlet element 7 can be actively heated by a heating device 5' that is associated with it.

Figure 3:
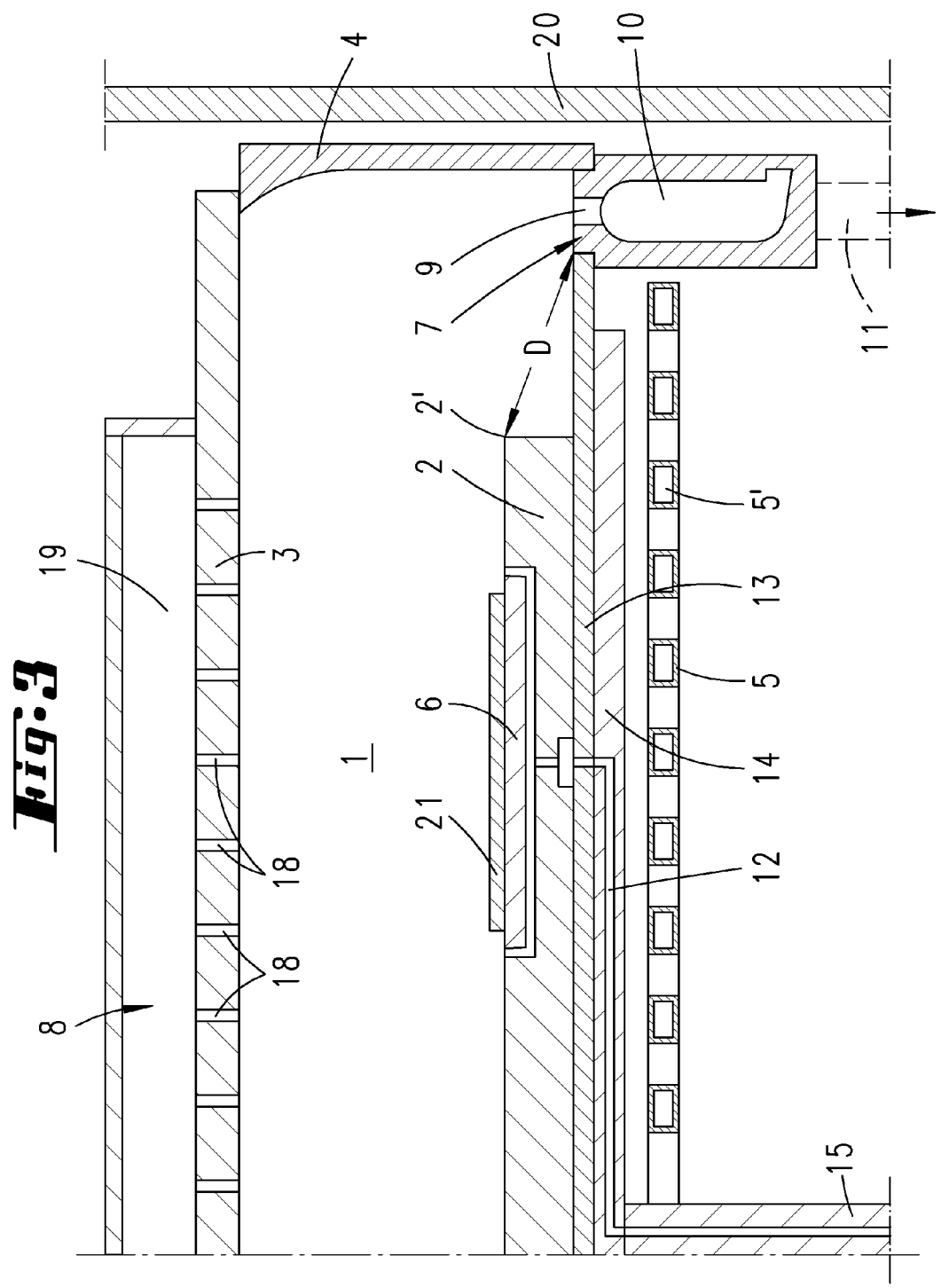
FIG. 3 shows an illustration corresponding to FIG. 1 of a second exemplary embodiment with a differently configured gas inlet element.

The exemplary embodiment shown in FIG. 3 differs from the exemplary embodiment shown in FIG. 1 mainly in the configuration of the gas inlet element 8. The gas inlet element is here formed as a showerhead and has a configuration as is described by EP 0 687 749 B1, namely a multiplicity of outlet openings 18 arranged on the process chamber ceiling 3 for entry of the process gas into the process chamber 1. Above this gas outlet opening 18, a gas distribution volume is indicated by the reference numeral 19. Only a single gas volume is illustrated in FIG. 3. In preferred configurations, a plurality of gas volumes may however be provided, as is described for example by EP 0 687 749 B1.

Figure 4:
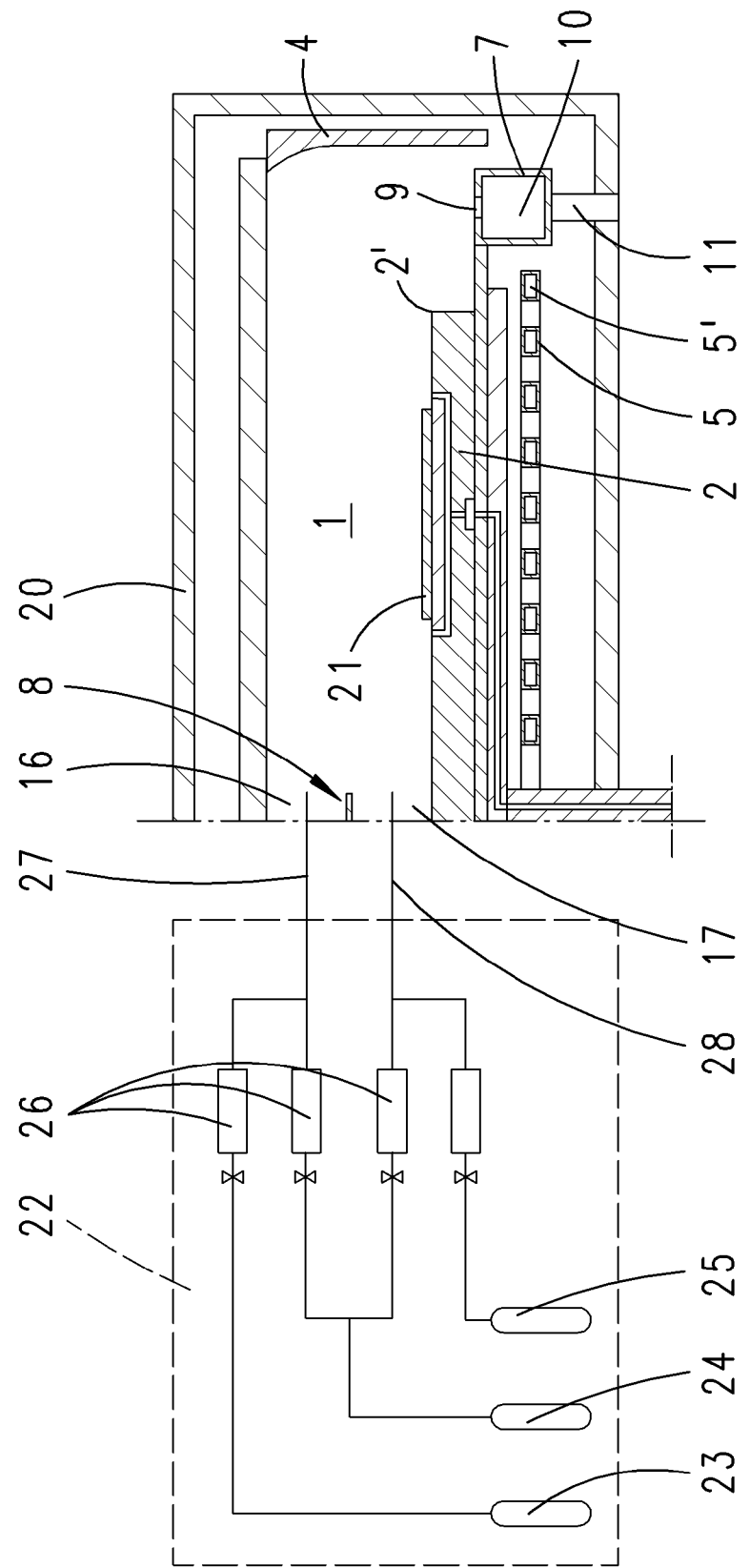
FIG. 4 shows a further exemplary embodiment, in which the significant components of the process chamber are illustrated in a roughly schematic manner and in addition a gas mixing system.

In the exemplary embodiment illustrated in FIG. 4, there is likewise in question a horizontal reactor, in which the openings 9 of the gas outlet element 7 are below the horizontal level of the surface of the susceptor 2 that carries the substrate 21.

In the process carried out in the aforementioned apparatus, a plurality of process steps are carried out one after the other, without the gas outlet element having to be cleaned or changed between the process steps. There comes about therefore at least in the first process step a coating of the gas outlet element 7 with decomposition products of the process gases. The first process step is carried out at a low temperature, e.g. at a temperature between 500° C. and 1,000° C. In this process step, there is deposited on the substrate a III-V semiconductor layer by the introduction of an organometallic substance and a hydride. A parasitic coating is also deposited from these decomposition products on the surfaces of the gas outlet element 7. By a separate management of the temperature of the gas outlet element 7, the temperature of this element is held in a narrow temperature range. The total pressure within the process chamber is in the range between 1 mbar and 1,000 mbar. Preferably the total pressure is between 20 mbar and 500 mbar.

Subsequent to this first process step, further intermediate steps may be carried out. Further layers may be deposited on the first layer under different process temperatures and different total pressures and using other process gases. It is also possible to remove the already coated substrates from the process chamber before a second process step according to the invention and to introduce virgin substrates into the process chamber. The second process step according to the invention differs from the first process step according to the invention mainly by its process temperature. This should be higher that the process temperature in the first process step. The second process step may be carried out at temperatures between 1,000° C. and 1,600° C., so that the two process temperatures differ by at least 500° C. Thus the second process step may be a deposition process or merely a heat treatment process.

The above mentioned spacing D between the downstream edge 2' of the susceptor 2 and the gas outlet element 7 is selected so that for the process parameters of the second process step, thus for the second process temperature and for the total pressure during the second process step, no reverse diffusion or reverse circulation of decomposition products, or fragments or agglomerations of these products, evaporating from the coating on the gas outlet element, reach the substrate 21. For this, the spacing D corresponds at least to three times the reverse diffusion length of the evaporated material in question. The reverse diffusion length is a characteristic value which is derived from the exponentially decaying course of the concentration depletion curve. For this, a line is drawn through the 90% point and the 10% point of the depletion curve. The point of intersection of the lines with the X-axis, on which the spacing is marked, defines the diffusion length. This is 15 mm for the magnesium-in-hydrogen system at 400 mbar and a wall temperature of 600° C. The minimum value for the spacing D in this system is then 45 mm. It is optimal to apply here a value of 60 mm.

By the active heating of the gas outlet element 7 by means of the heating device 5', the surface temperature of the element is moreover held at values which are at a maximum approximately 100° C. greater than the surface temperatures of the element during the first process step. As a result of this measure, the evaporation rate of coatings on the gas outlet element 7 is at least minimised or does not change.

The surface of the support plate 13 in the spacing region D is selected so that only a minimal deposition forms there.

All features disclosed are (in themselves) pertinent to the invention. The disclosure content of the associated/accompanying priority documents (copy of the prior application) is also hereby included in full in the disclosure of the application, including for the purpose of incorporating features of these documents in claims of the present application.

What is claimed is:

1. A method for depositing semiconductor layers consisting of a plurality of components on one or more substrates (21) which are supported on a susceptor (2), the susceptor forming a wall portion of a process chamber (1), said wall portion being heated by a heating device (5) to a process temperature, process gases containing an organometallic component of the II or III main group and a hydride of the V or VI main group and provided by a gas mixing system (22) being introduced together with a carrier gas into the process chamber (1) through flow channels (15, 16, 18) of a gas inlet element (8), which carrier gas flows through the process chamber (1) substantially parallel to the susceptor and leaves through a gas outlet element (7), the process gases decomposing into products of decomposition in a pyrolytic manner at least on a surface of the heated substrate (21) and the decomposition products growing to form a coating at least in certain regions on the substrate surface and on a surface of the gas outlet element (7) that is located downstream at a spacing (D) from a downstream edge (2') of the susceptor, a first process step being carried out at a first process temperature and after that, a second process step being carried out at a second process temperature without intervening cleaning or exchange of the gas outlet element (7) coated by growth of decomposition products, the second process temperature being higher than the first process temperature by at least 500° C., the method characterized in that the spacing (D) is sufficiently great to prevent the decomposition products, or fragments or agglomerations of the decomposition products, evaporating, at the second process temperature, from the coating on the gas outlet element (7), from reaching the substrate (21) by reverse flow diffusion or recirculation, and further characterized in that heating of the gas outlet element (7) is controlled during the two process steps so that its surface temperatures during both process steps differ from one another only by 100° C. at a maximum.

2. The method according to claim 1, further characterized in that the deposition method is a metal organic chemical vapor deposition (MOCVD) method and the process gases contain elements of the III and IV main groups or elements of the II and VI main groups.

3. The method according to claim 1, further characterized in that different layers are deposited on the substrate (21) in the two process steps, using a different material composition.

4. The method according to claim 1, further characterized in that the spacing (D) corresponds at least to three times a diffusion length of the evaporated decomposition products.

5. The method according to claim 1, further characterized in that the gas outlet element (7) is actively heated by the heating device and the surface temperature of the gas outlet element (7) during the two process steps only changes to such extent that it lies above an adduct formation temperature for both process steps.

6. The method according to claim 1, further characterized in that the first process step is a deposition process and the second process step is a heat treatment step that is carried out optionally after an exchange of the substrates.

7. An apparatus for depositing semiconductor layers, consisting of a plurality of components, on one or more substrates (21), the apparatus comprising:

a susceptor (2), on which the substrate (21) is supported and which forms a wall portion of a process chamber (1), said wall portion being heated by a heating device (5) to a process temperature;

a gas inlet element (8) connected to a gas mixing system (22) by means of gas feed lines (27, 28), process gases provided by the gas mixing system (22) being introducible together with a carrier gas into the process chamber (1) through flow channels (15, 16, 18) of the gas inlet element (8), the process gases containing an organometallic component of the II or III main group and a hydride of the V or VI main group and being stored in reservoirs (23, 25) of the gas mixing system (22), the flow channels (15, 16, 18) and the gas outlet element (7) through which the gases leave the process chamber (1) being arranged in the process chamber (1) in such a way that the carrier gas flows through the process chamber (1) substantially parallel to the susceptor (2);

the susceptor (2) and the gas outlet element (7) that is located downstream from the susceptor (2) and at a spacing (D) from a downstream edge (2') of the susceptor being heatable directly or indirectly by the heating device (5) in such a way that the process gases decompose into products of decomposition at least on a surface of the substrate (21) and the decomposition products grow to form a coating at least in certain regions, in a pyrolytic manner, on hot surfaces of the substrate (21) and the gas outlet element (7), the apparatus characterized in that the spacing (D) is sufficiently great to prevent the decomposition products, or fragments or agglomerations of the decomposition products, evaporating from the coating on the gas outlet element (7), from reaching the substrate (21) by reverse flow diffusion or recirculation, and further characterized in that heating of the gas outlet element (7) can be controlled during two process steps that have process temperatures that differ by at least 500° C. so that its surface temperatures during the two process steps differ from one another only by 100° C. at a maximum.

8. The apparatus according to claim 7, further characterized in that the susceptor (2) is supported on a support plate (13), an edge region of which extends outwardly beyond the downstream edge (2') of the susceptor (2) as far as the gas outlet element.

9. The apparatus according to claim 8, further characterized in that the support plate (13) consists of quartz and the susceptor (2) consists of graphite, the support plate (13) further forming a diffusion barrier.

10. The apparatus according to claim 9, further characterized by a plate (14) that is disposed underneath the support plate (13) and likewise consists of quartz.

11. The apparatus according to claim 8, further characterized in that the gas outlet element (7) directly adjoins an outer edge of the support plate (13).

12. The apparatus according to claim 7, further characterized in that the heating device (5) is formed by one or more radio-frequency (RF) spirals that are located underneath the susceptor (2), an outermost winding (5') of the RF spirals actively heating the gas outlet element (7).

13. The apparatus according to claim 7, further characterized in that the process chamber (1) is circular, the gas outlet element (7) encircles the process chamber (1), and the gas outlet element (7) has a multiplicity of openings (9), through which the carrier gas and reaction products of the process gases reach a collecting volume (10) of the gas outlet element (7), which volume is connected to a vacuum pump by way of a discharge channel (11).

14. The apparatus according to claim 13, further characterized in that the openings (9) of the gas outlet element (7) face a ceiling (3) of the process chamber (1).

15. The apparatus according to claim 7, further characterized in that the gas feed lines (27, 28) are connected to reservoirs (23, 24, 25) via interposed mass flow regulators (26) and valves, a first one of the reservoirs (24) containing a carrier gas, a second one of the reservoirs (23) containing an organometallic substance and a third one of the reservoirs (25) containing a hydride.

16. The apparatus according to claim 7, further characterized in that the gas outlet element (7) is located vertically lower than the susceptor (2) that extends in a horizontal plane.

17. The apparatus according to claim 7, further characterized in that the spacing (D) is greater than 45 mm.

* * * * *